United States Patent
Oguma et al.

(10) Patent No.: US 10,649,036 B2
(45) Date of Patent: May 12, 2020

(54) BATTERY STATE ESTIMATING APPARATUS

(71) Applicant: TOYOTA JIDOSHA KABUSHIKI KAISHA, Toyota-shi, Aichi-ken (JP)

(72) Inventors: Yasumasa Oguma, Tokyo-to (JP); Tetsuya Osaka, Tokyo (JP); Tokihiko Yokoshima, Tokyo (JP); Shingo Tsuda, Tokyo (JP); Kazuaki Utsumi, Tokyo (JP); Daikichi Mukoyama, Tokyo (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 266 days.

(21) Appl. No.: 15/915,935

(22) Filed: Mar. 8, 2018

(65) Prior Publication Data
US 2018/0275201 A1   Sep. 27, 2018

(30) Foreign Application Priority Data

Mar. 22, 2017   (JP) .................. 2017-056058

(51) Int. Cl.
| | |
|---|---|
| *G01R 31/389* | (2019.01) |
| *G01R 31/367* | (2019.01) |
| *G01R 31/374* | (2019.01) |
| *G01R 31/387* | (2019.01) |
| *G01R 31/392* | (2019.01) |

(52) U.S. Cl.
CPC ......... *G01R 31/389* (2019.01); *G01R 31/367* (2019.01); *G01R 31/374* (2019.01); *G01R 31/387* (2019.01); *G01R 31/392* (2019.01)

(58) Field of Classification Search
CPC .. G01R 31/389; G01R 31/387; G01R 31/392; G01R 31/367; G01R 31/374; H01L 27/16
USPC ... 324/425–435, 500, 750.3, 757.04, 762.03, 324/600, 663, 671, 200, 207.13, 207.22,
(Continued)

(56) References Cited

U.S. PATENT DOCUMENTS 10,302,707 B2 * 5/2019 Gach ..................... H02J 7/0021
10,393,812 B2 * 8/2019 Heiries ............... G01R 31/389
(Continued)

FOREIGN PATENT DOCUMENTS

| CN | 105393129 A | 3/2016 |
|---|---|---|
| JP | 2014-126532 A | 7/2014 |

(Continued)

*Primary Examiner* — Melissa J Koval
*Assistant Examiner* — Trung Nguyen
(74) *Attorney, Agent, or Firm* — Oliff PLC

(57) ABSTRACT

A battery state estimating apparatus is provided with: an acquirer configured to obtain complex impedances of a battery at a different temperatures; a calculator configured to calculate a slope of a first straight line or a slope of a second straight line as an impedance slope, wherein the first straight line connects values of the complex impedances at a first predetermined frequency, wherein the second straight line connects a convergence point and at least one of values of the plurality of complex impedances at a second predetermined frequency; and an estimator configured to estimate a battery state associated with the battery on the basis of the impedance slope and a relation stored in a storage, if it is determined by a determinator that a temperature of the battery is in a predetermined temperature area.

8 Claims, 16 Drawing Sheets

(58) Field of Classification Search
USPC ............. 324/239, 241, 515, 520, 530, 76.11, 324/105–124
See application file for complete search history.

(56) References Cited

U.S. PATENT DOCUMENTS

2013/0156072 A1    6/2013   Hebiguchi
2014/0229130 A1    8/2014   Koba et al.
2016/0195577 A1    7/2016   Osaka et al.

FOREIGN PATENT DOCUMENTS

JP    WO2013/018641 A1    3/2015
JP    WO2013/114669 A1    5/2015

\* cited by examiner

BATTERY STATE ESTIMATING APPARATUS

CROSS-REFERENCE TO RELATED APPLICATIONS

This application is based upon and claims the benefit of priority of the prior Japanese Patent Application No. 2017-056058, filed on Mar. 22, 2017, the entire contents of which are incorporated herein by reference.

BACKGROUND

1. Technical Field

Embodiments of the present disclosure relate to a battery state estimating apparatus configured to estimate a state of a battery mounted on a vehicle or the like.

2. Description of the Related Art

For this of apparatus, there is known an apparatus configured to estimate a charge amount, a degradation or deterioration state, or the like of a battery by analyzing an impedance of the battery. For example, in International Publication No. WO2013/114669 (Patent Literature 1), there is proposed a technique/technology in which the charge amount of the battery is detected from an angle of a slope of a straight line connecting two or more complex impedances with different frequencies. Moreover, in International Publication No. WO2013/018641 (Patent Literature 2), there is proposed a technique/technology in which an internal impedance is measured by using a signal with a frequency that is hardly followed by ions in a power storage apparatus and in which an internal temperature of the power storage apparatus is calculated from a measured value.

Moreover, for a method of calculating the impedance of the battery, for example, Japanese Patent Application Laid Open No. 2014-126532 (Patent Literature 3) discloses a technique/technology in which a response signal to an inputted rectangular wave signal is Fourier-transformed and in which an impedance characteristic of an electrochemical cell is calculated on the basis of a calculated frequency characteristic.

The impedance of the battery is caused by charge transfer or the like, and thus has a significant temperature dependence. Therefore, even in a change in temperature of e.g., ±5 degrees C., it is hard to estimate the state of the battery on the basis of the impedance.

The temperature of the battery can be detected by using a temperature sensor or the like; however, the temperature detected by such a sensor does not always match an actual internal temperature of the battery. Moreover, there are variations in temperature in a plane or in a space in the battery. It is thus hard to detect a temperature to be associated with the impedance with pinpoint accuracy. In the technique/technology descried in the Patent Literature 2, the internal temperature of the battery is detected by using a frequency area that is hardly influenced by the temperature dependence. A resistance component in a high frequency area includes a terminal resistance, an electron resistance in an electrode body, and an electrolyte resistance. If the resistances other than the electrolyte resistance, which exhibits the temperature dependence, are changed, measurement accuracy is extremely reduced.

In the technique/technology descried in the Patent Literature 1, the impedance is used to detect the state of the battery; however, the temperature of the battery is not considered. Thus, even at the same frequency, a detected value of the impedance may vary depending on the temperature of the battery, and as a result, the state of the battery may not be accurately detected, which is technically problematic.

In view of the aforementioned problems, it is therefore an object of embodiments of the present disclosure to provide a battery state estimating apparatus configured to accurately estimate the state of the battery by using the impedance.

<1>

The above object of embodiments of the present disclosure can be achieved by a battery state estimating apparatus provided with: an acquirer configured to obtain a plurality of complex impedances of a battery at a plurality of different temperatures; a calculator configured to calculate a slope of a first straight line or a slope of a second straight line as an impedance slope on a complex plane having an axis that is a real component of the complex impedance and an axis that is an imaginary component of the complex impedance, wherein the first straight line connects values of the obtained plurality of complex impedances at a first predetermined frequency, wherein the second straight line connects a convergence point and at least one of values of the plurality of complex impedances at a second predetermined frequency, wherein the convergence point is a point on which intersections of straight lines and the axis that is the real component converge when the second predetermined frequency is changed, and wherein each of the straight lines connects the values of the complex impedances at the second predetermined frequency; a determinator configured to determine whether or not a temperature of the battery is in a predetermined temperature area; a storage configured to store in advance a relation between the impedance slope and a battery state associated with the battery; and an estimator configured to estimate the battery state associated with the battery on the basis of the calculated impedance slope calculated by the calculator and the relation stored in the storage, if it is determined that the temperature of the battery is in the predetermined temperature area.

According to the battery state estimating apparatus in embodiments of the present disclosure, the impedance slope on the complex plane is calculated from the plurality of complex impedances obtained at the plurality of different temperatures. Specifically, the impedance slope is calculated as the slope of the first straight line (or approximate straight line) connecting the values of the plurality of complex impedances at the first predetermined frequency, or as the slope of the second straight line (or approximate straight line) connecting the convergence point and at least one of the values of the plurality of complex impedances at the second predetermined frequency, wherein the convergence point is the point on which the intersections of the straight lines (or approximate straight lines) and the axis that is the real component converge when the second predetermined frequency is changed, and wherein each of the straight lines connects the values of the complex impedances at the second predetermined frequency.

According to studies by the present inventors, it has been found that the use of the impedance slope makes it possible to accurately estimate the battery state while eliminating an influence of the temperature dependence of the complex impedances. In other words, the battery state can be estimated without depending on the temperature of the battery. The "battery state" indicates quantitative or qualitative characteristics of the battery, which may change with time or which may vary depending on a time point, such as, e.g., a state of charge (SOC) and a state of health (SOH).

On the other hand, it has been also found that the battery state cannot be accurately estimated in a partial temperature area even if the use of the impedance slope makes it possible to eliminate the temperature dependence. Therefore, in the present disclosure, the battery state is estimated on the basis of the impedance slope if it is determined that the temperature of the battery is in the predetermined temperature area. Here, the "predetermined temperature area" may be set as a temperature area in which the battery state can be estimated without depending on the temperature of the battery (or in other words, an area other than an area in which the battery state cannot be accurately estimated), by using the impedance slope. Moreover, in the determination of the temperature of the battery by the determinator, it is sufficient to use information that allows the determination of whether or not the temperature of the battery is in the temperature area in which the battery state cannot be accurately estimated, and it is not required to use information indicating a specific temperature. According to the present disclosure, it is therefore possible to estimate the battery state without performing accurate temperature detection, temperature adjustment, or the like, in estimating the battery state.

<2>

In one aspect of the battery state estimating apparatus according to embodiments of the present disclosure, the estimator is configured not to estimate the battery state associated with the battery if it is determined that the temperature of the battery is not in the predetermined temperature area.

According to this aspect, the battery state is not estimated if the temperature of the battery is not in the predetermined temperature area. It is thus possible to prevent the battery state from being erroneously estimated.

<3>

In an aspect including the determinator described above, the determinator may be configured (i) to obtain information about an intersection of the first or second straight line and the axis that is the real component, (ii) to determine that the temperature of the battery is in the predetermined temperature area if the intersection is in a predetermined range, and (iii) to determine that the temperature of the battery is not in the predetermined temperature area if the intersection is not in the predetermined range.

In this case, whether or not the temperature of the battery is in the predetermined temperature area is determined depending on whether or not the intersection of the first or second straight line and the real component axis for defining the complex plane is in the predetermined range. The "predetermined range" herein may be set as a range in which a distribution of the intersection converges if the temperature of the battery is in the predetermined temperature area. Due to the temperature dependence of the distribution of the intersection, it is possible to indirectly estimate the temperature of the battery depending on whether or not the distribution of the intersection converges. In this aspect, it is thus possible to determine whether or not the temperature of the battery is in the predetermined temperature area, from the complex impedances, without directly detecting the temperature of the battery. It is therefore possible to determine whether or not to perform the estimation process.

<4>

In an aspect including the determinator described above, the determinator may be configured (i) to obtain information about a slope of the first or second straight line, (ii) to determine that the temperature of the battery is in the predetermined temperature area if the slope of the first or second straight line is in a predetermined slope range, and (iii) to determine that the temperature of the battery is not in the predetermined temperature area if the slope of the first or second straight line is not in the predetermined slope range.

In this case, whether or not the temperature of the battery is in the predetermined temperature area is determined depending on whether or not the slope of the first or second straight line is in the predetermined slope range. The "predetermined slope range" herein may be set as a range indicating a value corresponding to the slope of the first or second straight line if the temperature of the battery is in the predetermined temperature area. In this aspect, it is possible to determine whether or not the temperature of the battery is in the predetermined temperature area, from the complex impedances, without directly detecting the temperature of the battery. It is therefore possible to determine whether or not to perform the estimation process.

<5>

In an aspect including the determinator described above, the determinator may be configured (i) to obtain an acquisition temperature, which is a temperature of the battery when or before the acquirer obtains the plurality of complex impedances, (ii) to determine that the temperature of the battery is in the predetermined temperature area if the acquisition temperature is in the predetermined temperature area, and (iii) to determine that the temperature of the battery is not in the predetermined temperature area if the acquisition temperature is not in the predetermined temperature area.

In this case, whether or not the temperature of the battery is in the predetermined temperature area is determined depending on whether or not the acquisition temperature is in the predetermined temperature area, wherein the acquisition temperature is the temperature of the battery when or before (or preferably immediately before) the acquirer obtains the complex impedances. It is therefore possible to determine whether or not to perform the estimation process.

<6>

In another aspect of the battery state estimating apparatus according to embodiments of the present disclosure, the calculator is configured to calculate the impedance slope (i) by using a complex impedance obtained when the temperature of the battery is in the predetermined temperature area, but (ii) without using a complex impedance obtained when the temperature of the battery is not in the predetermined temperature area, out of the plurality of complex impedances obtained by the acquirer.

According to this aspect, out of the plurality of complex impedances, the complex impedance obtained when the temperature of the battery is not in the predetermined temperature area is not used to calculate the impedance slope. In other words, out of the plurality of complex impedances, only the complex impedance obtained when the temperature of the battery is in the predetermined temperature area is used to calculate the impedance slope. This makes it possible to estimate the battery state while eliminating the influence of the temperature dependence of the complex impedance that is not to be used to estimate the battery state and to accurately estimate the battery state. As a result, it is possible to accurately estimate the battery state.

<7>

In one aspect of the battery state estimating apparatus according to embodiments of the present disclosure, the battery state includes a value indicating a charge amount of the battery.

According to this aspect, it is possible to estimate the value indicating the charge amount of the battery (e.g., SOC).

<8>
In one aspect of the battery state estimating apparatus according to embodiments of the present disclosure, the battery state includes a value indicating a degradation degree of the battery.

According to this aspect, it is possible to estimate the value indicating a degradation or deterioration state of the battery (e.g., SOH).

The nature, utility, and further features of this disclosure will be more clearly apparent from the following detailed description with reference to embodiments of the disclosure when read in conjunction with the accompanying drawings briefly described below.

DETAILED DESCRIPTION OF THE EMBODIMENTS

A battery state estimating apparatus according to embodiments of the present disclosure will be explained with reference to the drawings.

First Embodiment

A battery state estimating apparatus 100 according to a first embodiment will be explained. The following is an example in which the battery state estimating apparatus 100 is configured to estimate a battery state associated with a battery of a vehicle.

(1) Configuration of Apparatus

Figure 1:
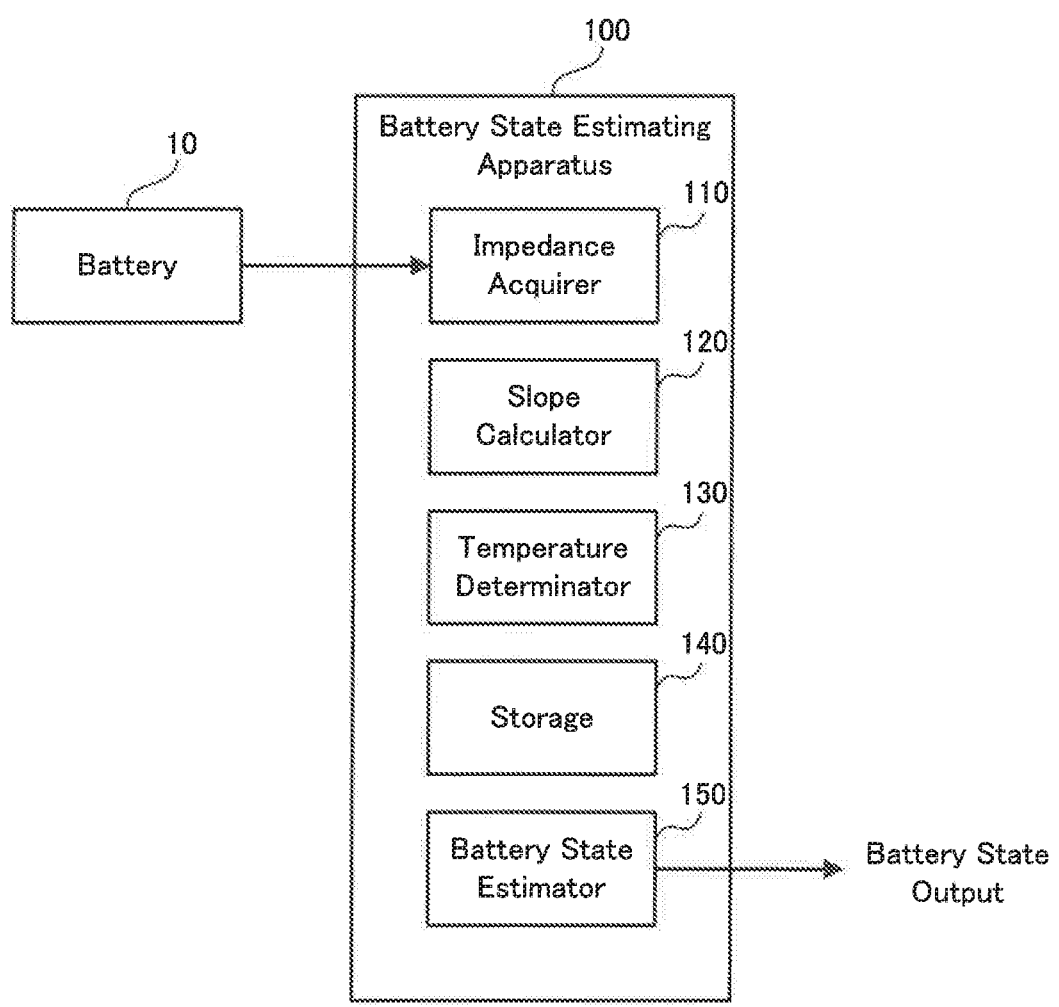
FIG. 1 is a block diagram illustrating a configuration of a battery state estimating apparatus according to a first embodiment.

Firstly, a configuration of the battery state estimating apparatus 100 according to the first embodiment will be explained with reference to FIG. 1. FIG. 1 is a block diagram illustrating the configuration of the battery state estimating apparatus 100 according to the first embodiment.

As illustrated in FIG. 1, the battery state estimating apparatus 100 according to the first embodiment is an electronic unit electrically connected to a battery 10 of a vehicle, and is configured to estimate a SOC, which is a battery state of the battery 10. The battery 10 is a specific example of the "battery", and is configured as a chargeable aqueous secondary battery, such as, for example, a lithium ion battery.

The battery state estimating apparatus 100 is provided with an impedance acquirer 110, a slope calculator 120, a temperature determinator 130, a storage 140, and a battery state estimator 150, as logical or physical processing blocks realized therein.

The impedance acquirer 110 is a specific example of the "acquirer", and is configured to obtain a complex impedance of the battery 10. The impedance acquirer 110 is configured to obtain the complex impedance, for example, by applying an alternating current (AC) voltage to the battery 10 while changing a frequency. A method of obtaining the complex impedance can use the exiting technique/technology, as occasion demands, and a detailed explanation herein will be thus omitted. The complex impedance of the battery 10 obtained by the impedance acquirer 110 may be outputted to the slope calculator 120.

The slope calculator 120 is a specific example of the "calculator", and is configured to calculate an impedance slope of the battery 10. The slope calculator 120 is configured to plot a plurality of complex impedances obtained by the impedance acquirer 110 on a complex plane, to draw a straight line (or an approximate straight line) connecting values of the complex impedances corresponding to a first predetermined frequency, and to calculate a slope of the straight line as the impedance slope. The "first predetermined frequency" may be set in advance to calculate the impedance slope, and may be appropriately selected from a frequency range of the AC voltage that is applied to the battery 10 to obtain the complex impedances. The impedance slope calculated by the slope calculator 120 may be outputted to the temperature determinator 130 and the battery state estimator 150.

The temperature determinator 130 is a specific example of the "determinator", and is configured to determine whether or not a temperature of the battery 10 is in a predetermined temperature area, on the basis of the impedance slope calculated by the slope calculator 120. The "predetermined temperature area" may be set in advance as a temperature area that is suitable to estimate the SOC or SOH of the battery 10 from the impedance slope. A specific content of a determination process performed by the temperature determinator 130 will be detailed later. A determination result of the temperature determinator 130 may be outputted to the battery state estimator 150.

The storage 140 is a specific example of the "storage", and is configured to include e.g., a read only memory (ROM) or the like. The storage 140 is configured to store a relation between the impedance slope of the battery 10, which is derived from previous simulation results, and the SOC or SOH. More specifically, for example, an operation of calculating the impedance slope when the SOC is known may be repeated while changing the SOC, and an association between the impedance slope and the SOC at that time may be stored in the storage 140. If the relation between the impedance slope and the SOC or SOH can be expressed by particular numerical equations, the storage 140 may store the numerical equations. Information stored in the storage 140 may be outputted to the battery state estimator 150 as occasion demands.

The battery state estimator 150 is a specific example of the "estimator", and is configured to estimate the SOC or SOH (i.e., the "battery state") from the impedance slope of the battery 10. The battery state estimator 150 is configured to estimate the SOC or SOH of the battery 10 on the basis of the slope of the complex impedances calculated by the slope calculator 120 and the relation between the impedance slope and the SOC, which is read from the storage 140. Whether or not the battery state estimator 150 performs a process of estimating the SOC or SOH of the batter 10 may be determined by a the determination result of the temperature deteminator 130, as described later.

The battery state estimator 150 is configured to output an estimated value of the SOC or SOH of the battery 10.

(2) Impedance Slope

Figure 2:
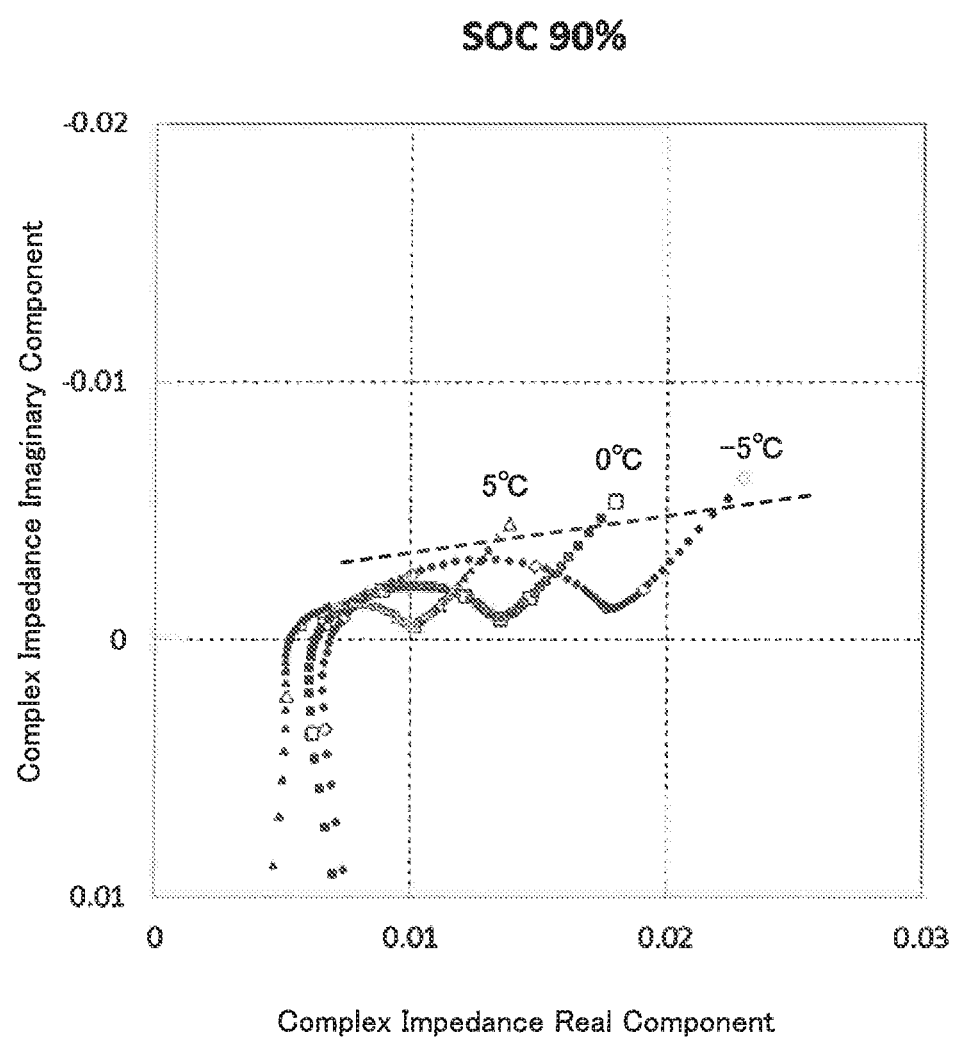
FIG. 2 is a graph illustrating an example of an impedance slope in SOC 90%.
Figure 3:
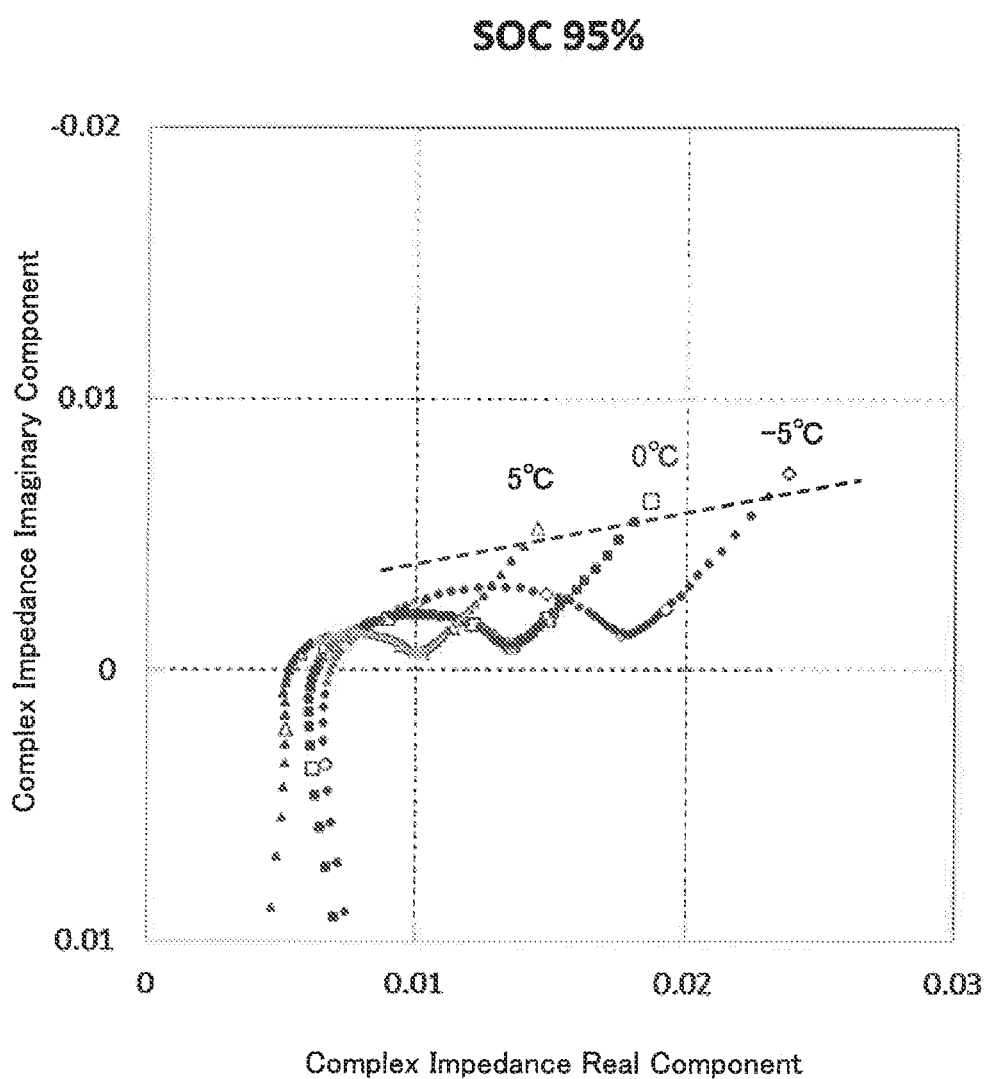
FIG. 3 is a graph illustrating an example of the impedance slope in SOC 95%.
Figure 4:
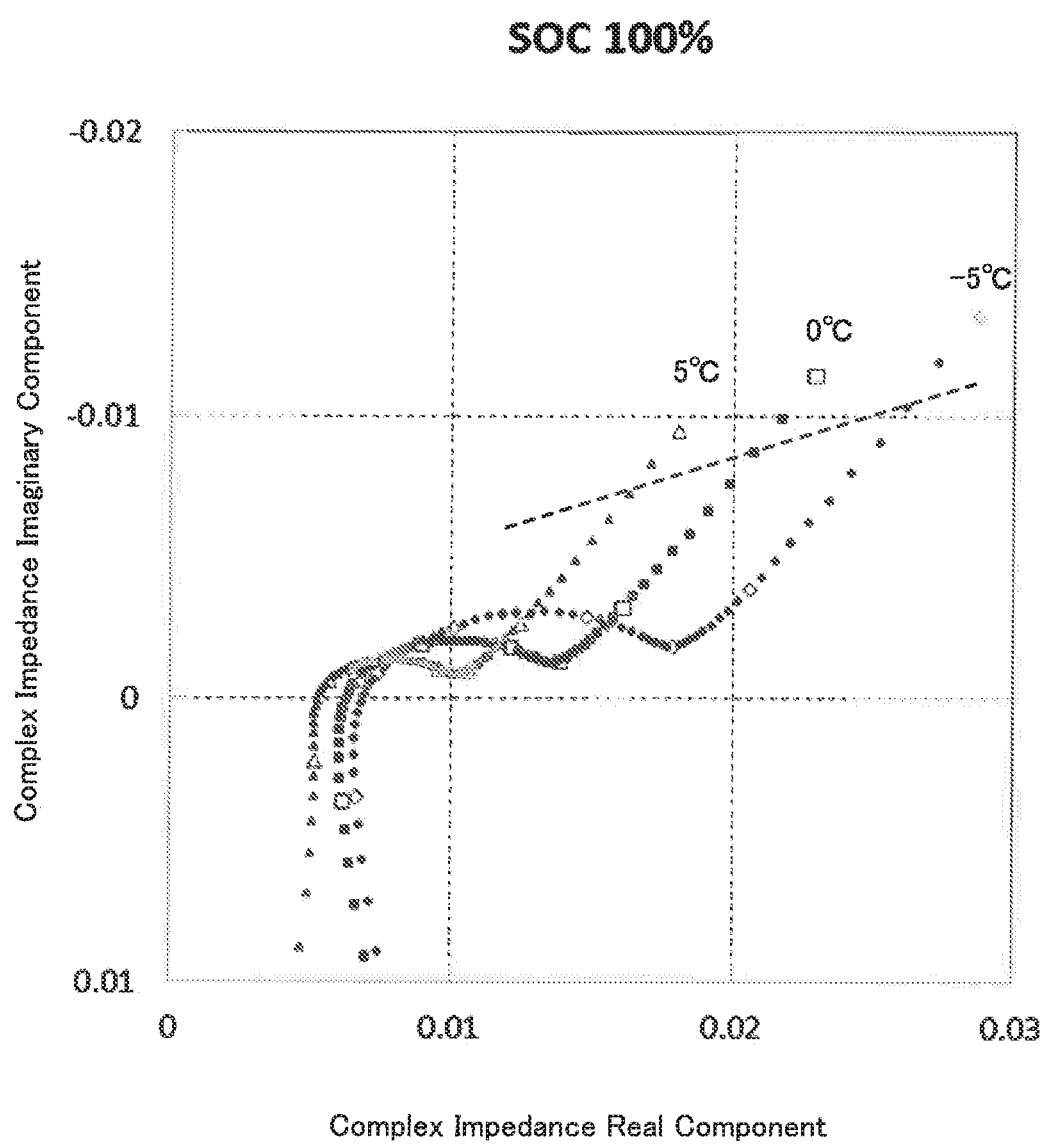
FIG. 4 is a graph illustrating an example of the impedance slope in SOC 100%.

Next, the impedance slope used on the battery state estimating apparatus 100 according to the first embodiment will be explained with reference to FIG. 2 to FIG. 4. FIG. 2 is a graph illustrating an example of an impedance slope in SOC 90%. FIG. 3 is a graph illustrating an example of the impedance slope in SOC 95%. FIG. 4 is a graph illustrating an example of the impedance slope in SOC 100%.

For convenience of explanation, FIG. 2 to FIG. 4 illustrate the complex impedances obtained in a condition in which the SOC of the battery 10 is accurately known. Moreover, the temperature of the battery 10 in the acquisition of the complex impedances is accurately known to be 5 degrees C., 0 degrees C., and −5 degrees C. In the calculation of the impedance slope, however, it is not necessarily required to know the accurate temperature of the battery 10. In other words, as long as the complex impedances are obtained at different temperatures, specific temperature values could be unknown.

As illustrated in FIG. 2, in the case of the SOC of the battery 10 of 90%, when complex impedances obtained at temperatures of the battery 10 of 5 degrees C., 0 degrees C., and −5 degrees C. are plotted on a complex plane, the complex impedances are drawn as different curves that are shifted to the right side with decreasing temperature. A straight line connecting values of the complex impedances corresponding to the first predetermined frequency (or 15.8 mHz herein) (which is specifically an approximate straight line derived from the values) has a slope of "−0.163". The impedance slope in this case is thus calculated as "−0.163".

As illustrated in FIG. 3, in the case of the SOC of the battery 10 of 95%, when complex impedances obtained at temperatures of the battery 10 of 5 degrees C., 0 degrees C., and −5 degrees C. are plotted on a complex plane to draw a straight line connecting values of the complex impedances corresponding to the first predetermined frequency (i.e. 15.8 mHz), the straight line has a slope of "−0.187". The impedance slope in this case is thus calculated as "−0.187".

As illustrated in FIG. 4, in the case of the SOC of the battery 10 of 100%, when complex impedances obtained at temperatures of the battery 10 of 5 degrees C., 0 degrees C., and −5 degrees C. are plotted on a complex plane to draw a straight line connecting values of the complex impedances corresponding to the first predetermined frequency (i.e. 15.8 mHz), the straight line has a slope of "−0.312". The impedance slope in this case is thus calculated as "−0.312".

As described above, the "impedance slope" according to the first embodiment is calculated as a slope of a straight line connecting values of complex impedances of the battery 10 corresponding to the first predetermined frequency, wherein the complex impedances are obtained under a plurality of temperature conditions.

(3) Method of Calculating SOC and SOH

Figure 5:
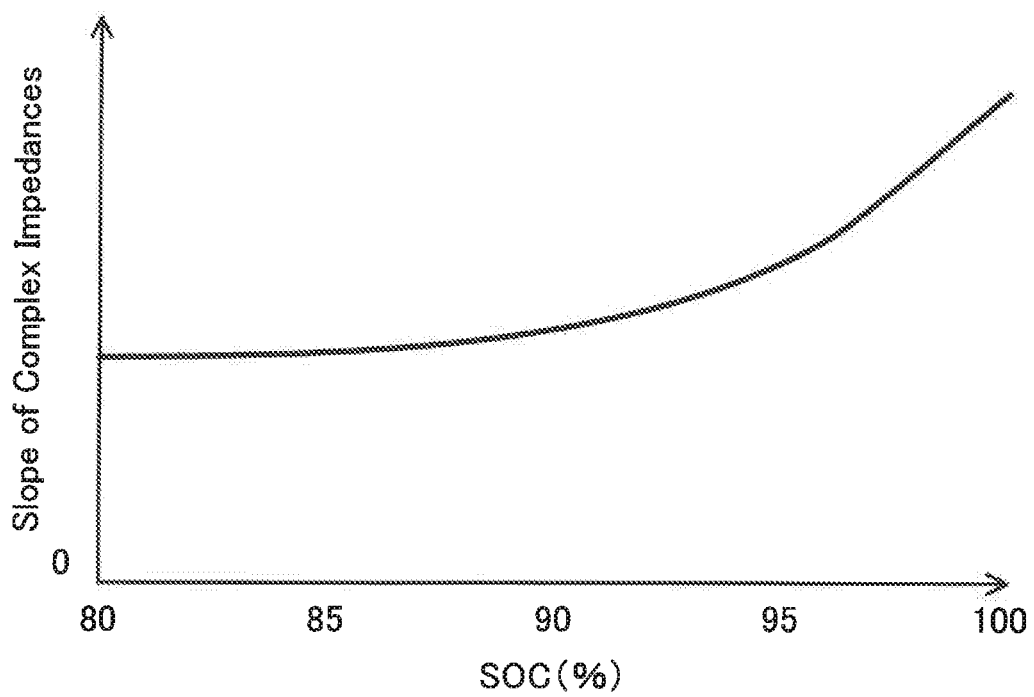
FIG. 5 is a map illustrating a relation between the impedance slope and a SOC.
Figure 6:
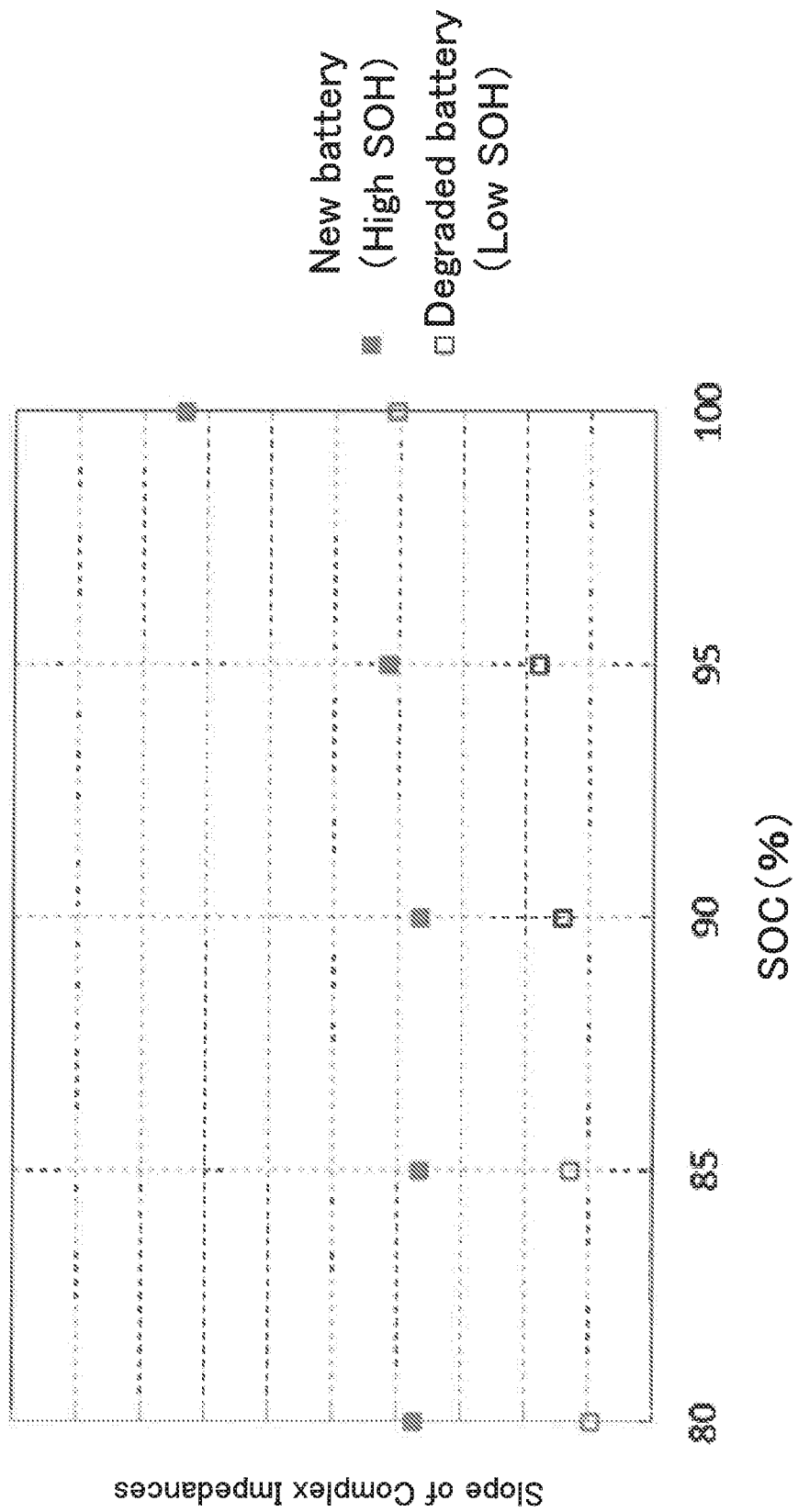
FIG. 6 is a map illustrating a relation between the impedance slope and a SOH.

Next, a method of calculating the SOC or SOH of the battery 10 by using the aforementioned impedance slope will be explained with reference to FIG. 5 and FIG. 6. FIG. 5 is a map illustrating a relation between the impedance slope and the SOC. FIG. 6 is a map illustrating a relation between the impedance slope and the SOH;

As illustrated in FIG. 5, according to the studies by the present inventors, it has been found that the impedance slope has a larger absolute value increasing SOC of the battery 10. The relation is also apparent from the data illustrated in FIG. 2 to FIG. 4. In accordance with the increase in the SOC of 90%, 95%, and 100%, the impedance slopes are respectively "−0.163", "−0.187", and "−0.312", and the absolute value of the impedance slope gradually increases.

As a result, if the impedance slope can be calculated by using the complex impedances obtained at different temperatures, the SOC of the battery 10 can be estimated from the value of the slope. Specifically, if the storage 140 stores the map illustrated in FIG. 5, it is possible to derive the value of the SOC corresponding to the calculated impedance slope.

Moreover, the complex impedance itself is a value having a temperature dependence. In the first embodiment, however, the relation between the impedance slope and the SOC has little temperature dependence, because the impedance slope is calculated as explained in FIG. 2 to FIG. 4. In other words, even if the temperature of the battery 10 is changed, there is little change in the relation illustrated in FIG. 5. It is therefore possible to accurately estimate the SOC of the battery 10, for example, even when it is hard to accurately detect the temperature of the battery 10.

As illustrated in FIG. 6, according to the studies by the present inventors, it has been found that the relation between the SOC of the battery 10 and the impedance slope varies depending on whether the battery 10 is new or degraded (or deteriorated). This is because the SOH of the battery 10 causes a change in the complex impedances obtained from the battery 10.

A new battery 10 and a degraded battery 10 have different values of the impedance slope corresponding to each SOC, and have different variation tendencies. Specifically, in a change in the SOC from 80% to 90%, the impedance slope decreases increasing SOC in the new battery 10, while the impedance slope increases increasing SOC in the degraded battery 10. Thus, the SOH of the battery 10 can be estimated by focusing on the variation tendency of the impedance slope when the SOC increases or decreases.

Even for the relation between the SOH of the battery 10 and the impedance slope, the influence of the temperature dependence is eliminated. Thus, the use of the impedance temperature makes it possible to accurately estimate the SOH of the battery 10 without depending on the temperature of the battery 10.

(4) Correction of Impedance Slope

Figure 7:
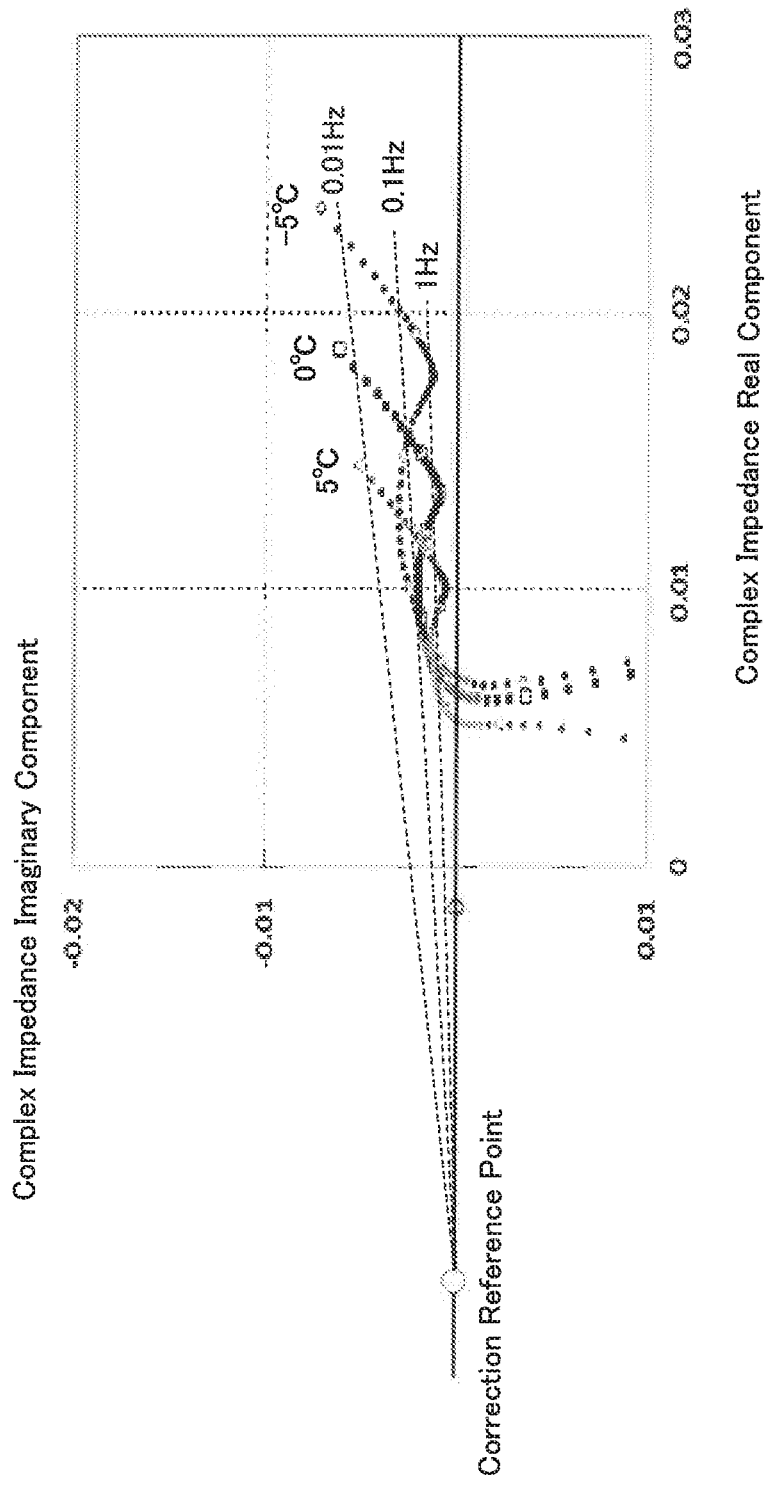
FIG. 7 is a graph illustrating intersections of straight lines, each of which indicates the impedance slope, and an X axis.
Figure 8:
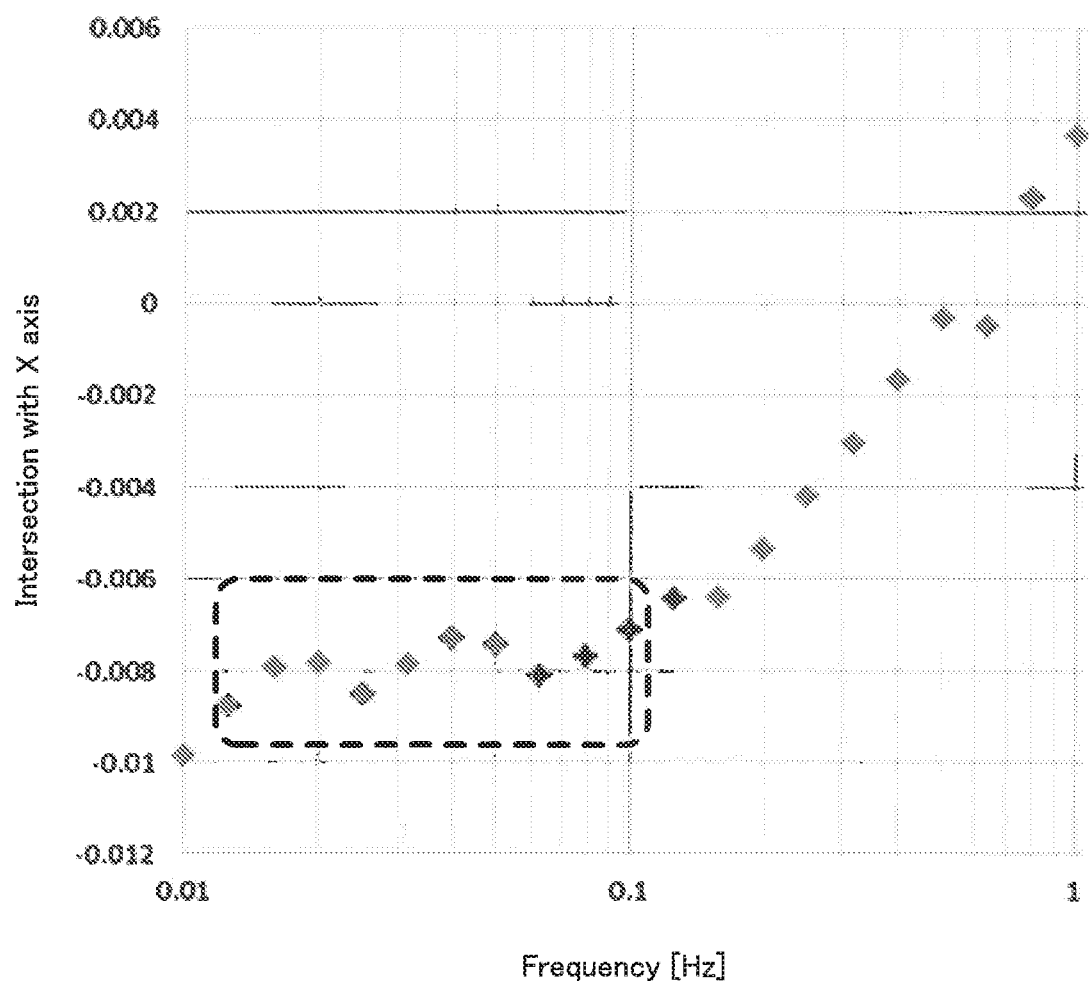
FIG. 8 is a graph illustrating that a distribution of the intersections of the straight lines, each of which indicates the impedance slope, and the X axis converges in a particular frequency band.

Next, a correction process for setting the impedance slope to be a more appropriate value will be explained with reference to FIG. 7 and FIG. 8. FIG. 7 is a graph illustrating intersections of straight lines, each of which indicates the impedance slope, and an X axis. FIG. 8 is a graph illustrating that a distribution of the intersections of the straight lines, each of which indicates the impedance slope, and the X axis converges in a particular frequency band.

As explained above, the use of the impedance slope makes it possible to estimate the SOC or SOH of the battery 10 while suppressing the influence of the temperature dependence. As described above, however, in some cases, it is insufficient to use only the slope of the straight line connecting the values of the complex impedances corresponding to the first predetermined frequency in order to completely eliminate the influence of the temperature dependence. The slope calculator 120 thus may perform a process of correcting the calculated impedance slope, as detailed below.

As illustrated in FIG. 7, in calculating the impedance slope, the slope calculator 120 is configured to calculate a straight line connecting values of a plurality of complex impedances corresponding to a second predetermined frequency, and is configured to calculate an intersection of the straight line and the X axis (i.e., an axis of a real component) on a complex plane. In the example illustrated in FIG. 7, the second predetermined frequency is changed to three frequencies, which are 0.01 Hz, 0.1 Hz, and 1 Hz, and three straight lines and three intersections of the three straight lines and the X axis are calculated. According to the studies by the present inventors, it has been found that the intersections of the plurality of straight lines and the X axis converge on one point in a particular frequency range.

As illustrated in FIG. 8, the plurality of intersections converge on an extremely narrow area in a range of the second predetermined frequency of 0.01 Hz to 0.1 Hz. The slope calculator 120 is configured to determine a point on which the plurality of intersections converge in this manner to be a correction reference point. The slope calculator 120 may determine a value obtained by averaging positions of the intersections that converge (i.e., intersections surrounded by a dashed line in the drawing) to be a position of the correction reference point.

After the determination of the correction reference point, the slope calculator 120 is configured to correct the impedance slope on the basis of the correction reference point. More specifically, the slope calculator 120 is configured to set a slope of a straight line (which is specifically an approximate straight line) connecting the correction reference point and any of the values of the plurality of complex impedances corresponding to the first predetermined frequency, as the impedance slope. In other words, the impedance slope is corrected as the slope of the straight line passing through the correction reference point.

Figure 9:
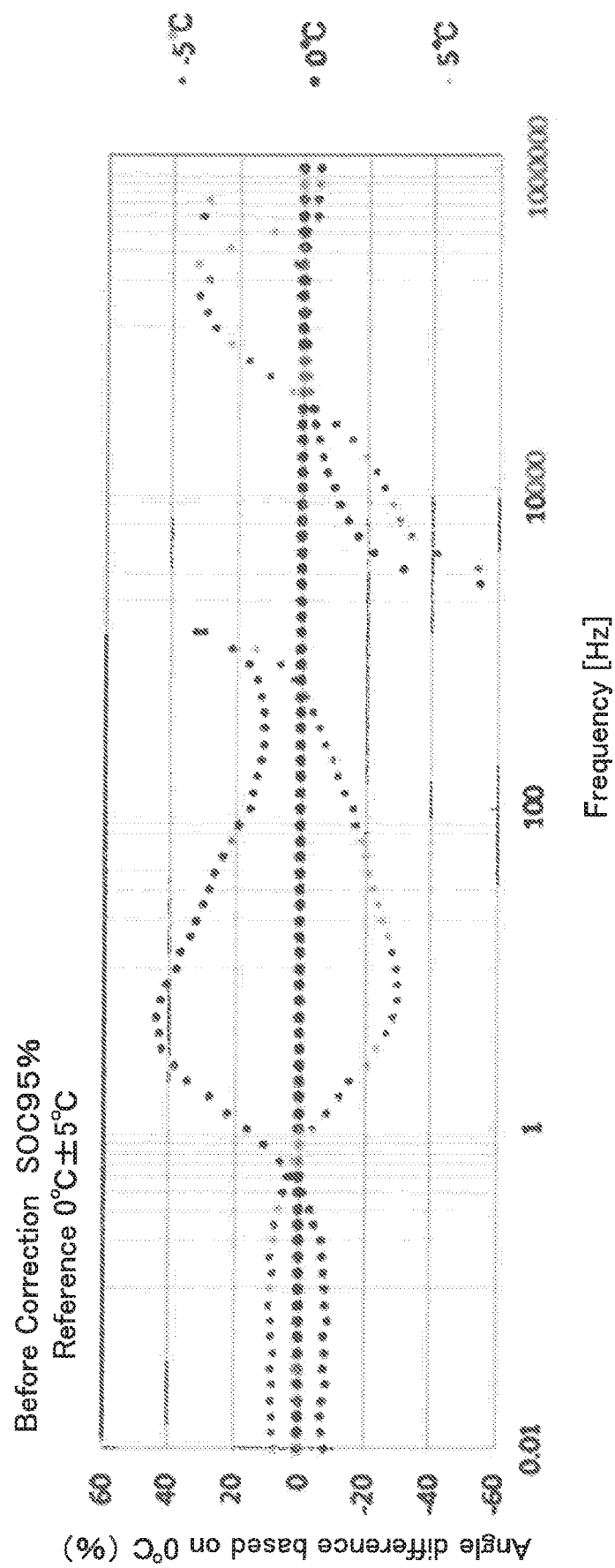
FIG. 9 is a diagram illustrating frequency characteristics of the impedance slope from an origin.
Figure 10:
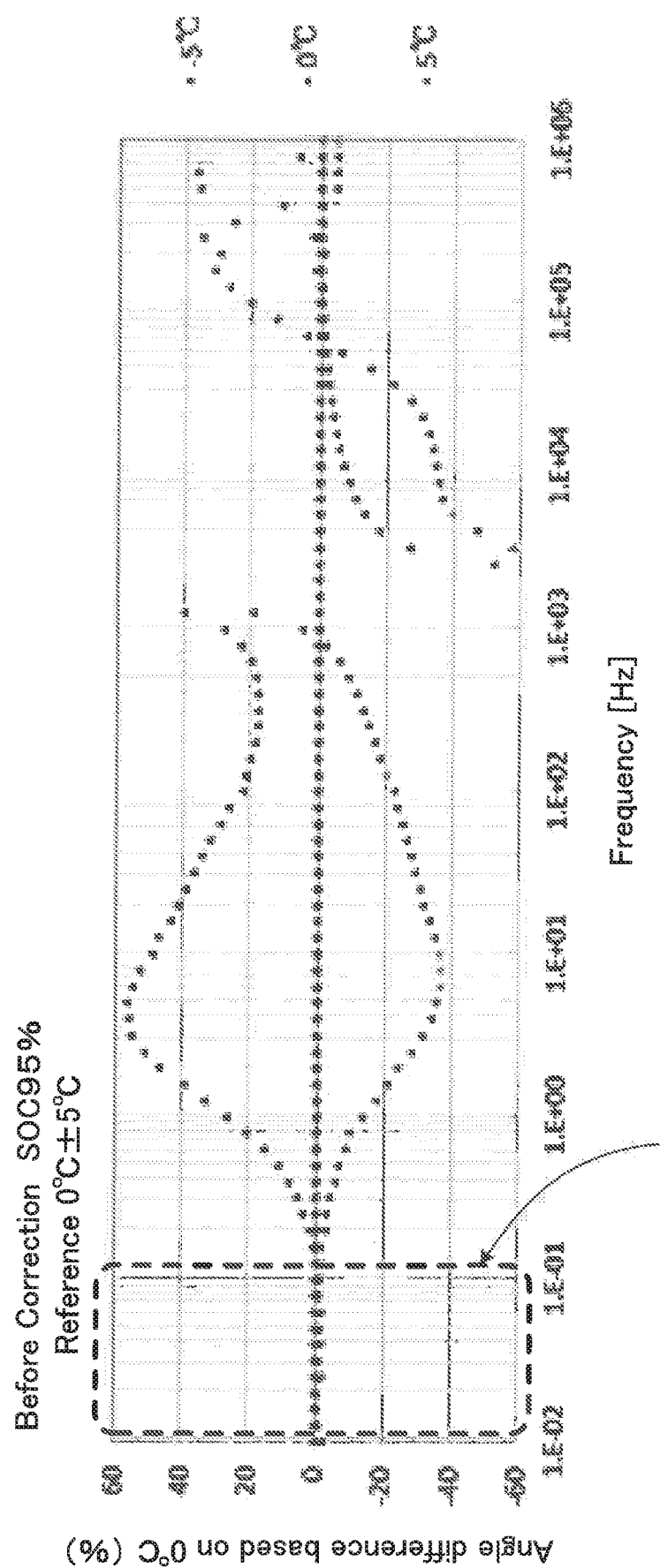
FIG. 10 is a diagram illustrating frequency characteristics of the impedance slope from a correction reference point.

Next, technical effect obtained by the correction using the correction reference point will be explained in detail with reference to FIG. 9 and FIG. 10. FIG. 9 is a diagram illustrating frequency characteristics of the impedance slope from an origin. FIG. 10 is a diagram illustrating frequency characteristics of the impedance slope from the correction reference point.

As illustrated in FIG. 9, the impedance slope from the origin has such frequency characteristics that there is an angle difference (or slope difference) to some extent in any case of 5 degrees C. and −5 degrees C., which are based on 0 degrees C. This indicates that the influence of the temperature dependence cannot be eliminated by simply calculating the impedance slope from the origin.

In contrast, as illustrated in FIG. 10, the impedance slope from the correction reference point has such frequency characteristics that there is no angle difference based on 0 degrees C. in a range of 0.01 Hz to 0.1 Hz (or a range surrounded by a dashed line in the drawing). This indicates that the influence of the temperature dependence can be almost completely eliminated in the range of 0.01 Hz to 0.1 Hz, by using the straight line passing through the correction reference point to correct the impedance slope. This effect is higher than that when the complex impedance is calculated from the straight line connecting the values corresponding to the first predetermined frequency.

As explained above, it is possible to estimate the SOC or SOH of the battery 10 by using the correction reference point to correct the impedance slope.

(5) Problems that May Occur in Estimating Battery State

Figure 11:
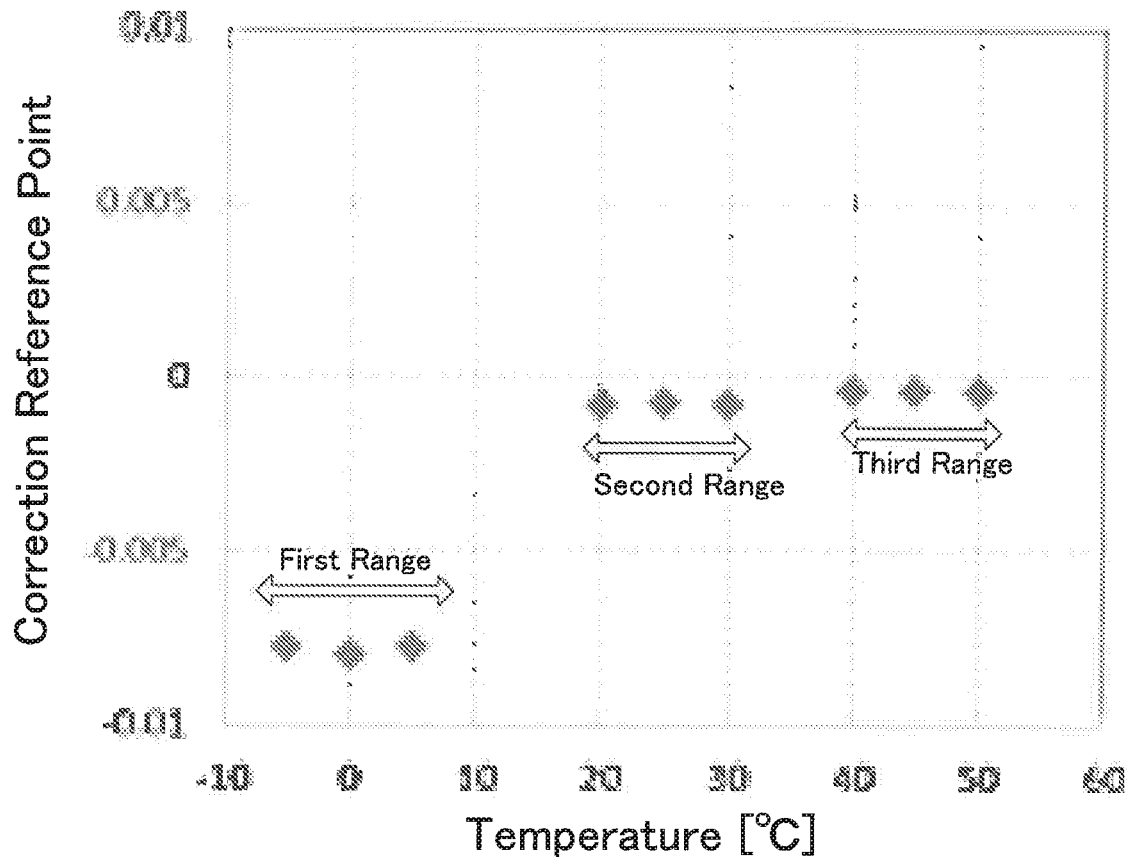
FIG. 11 is a map illustrating a relation between a battery temperature and the correction reference point.
Figure 12:
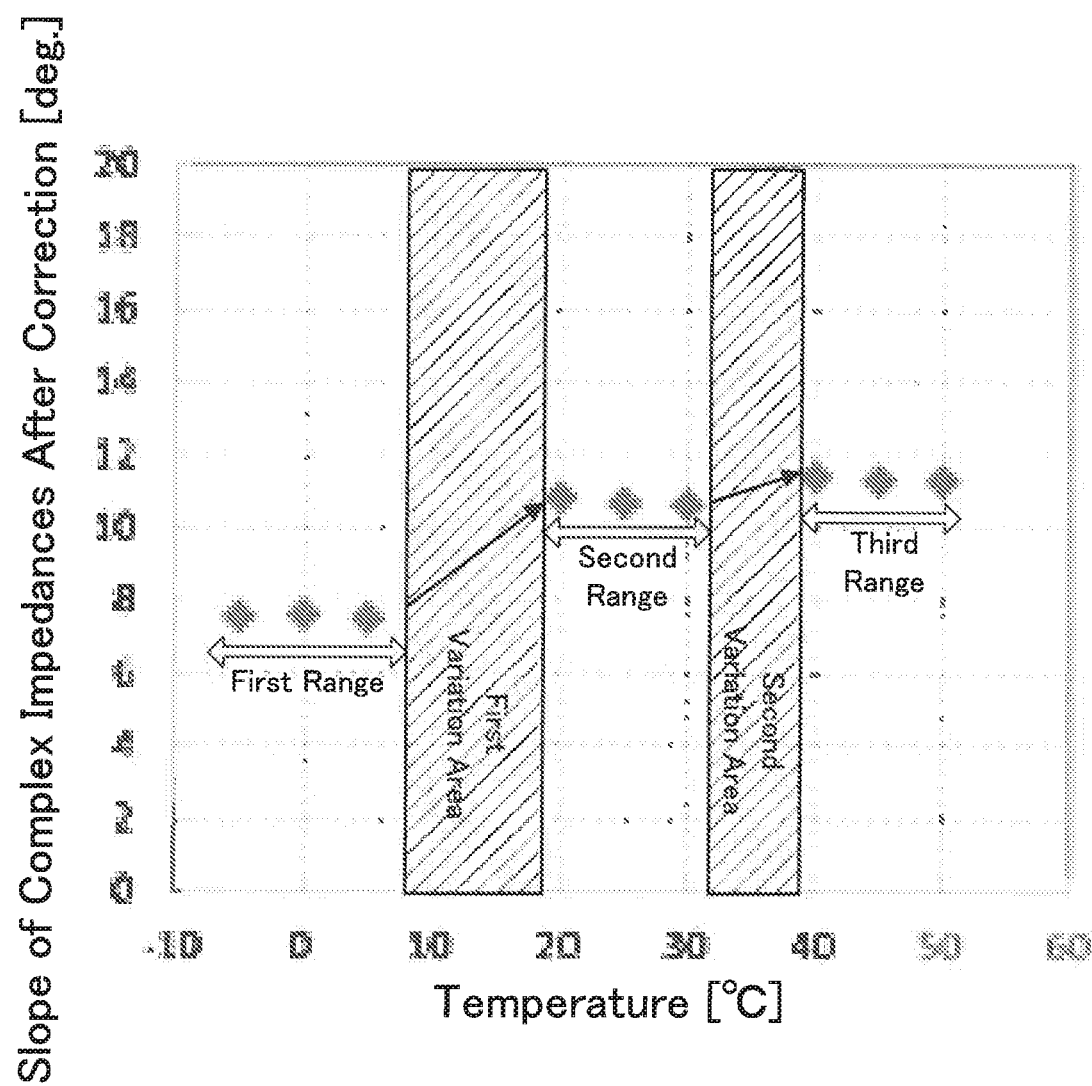
FIG. 12 is a map illustrating a relation between the battery temperature and the slope from the correction reference point.

Next, problems that may occur in estimating the SOC or SOH of the battery 10 by using the impedance slope will be explained with reference to FIG. 11 and FIG. 12. FIG. 11 is a map illustrating a relation between a battery temperature and the correction reference point. FIG. 12 is a map illustrating a relation between the battery temperature and the slope from the correction reference point.

According to the studies by the present inventors, it has been found that the battery state cannot be accurately estimated in a partial temperature area even if the use of the impedance slope makes it possible to eliminate the temperature dependence. Specifically, the relation between the complex impedance and the SOC or SOH is stable if the temperature of the battery 10 is in the predetermined temperature area, and the battery state can be thus accurately estimated. On the other hand, the relation between the complex impedance and the SOC or SOH is not stable in a partial area other than the predetermined temperature area, and as a result, there is a possibility that the battery state of the battery 10 cannot be accurately estimated.

For example, the data illustrated in FIG. 11 is a mapped relation between the temperature of the battery 10 and an intersection of the X axis and a straight line connecting values of a plurality of impedances corresponding to 0.03 Hz (i.e., the correction reference point), wherein the plurality of impedances are obtained at different temperatures. The temperature in the graph in FIG. 11 corresponds to a central temperature of the plurality of impedances used to calculate the correction reference point. For example, the correction reference point corresponding to a temperature of 20 degrees C. may be calculated by using a plurality of complex impedances obtained at 20 degrees C.±5 degrees C. (i.e., 15 degrees C., 20 degrees C., and 25 degrees C.).

As is clear from the drawing, for example, in a first range of −10 degrees C. to 10 degrees C., in a second range of 20 degrees C. to 30 degrees C., and in a third range of 40 degrees C. to 50 degrees C., the position of the intersection hardly varies (i.e., is constant) even if the temperature of the battery 10 is changed. However, in a range located between the first range and the second range in which the temperature of the battery is from 10 degrees C. to 20 degrees C., the position of the intersection with the X axis significantly varies. Moreover, in a range located between the second range and the third range in which the temperature of the battery is from 30 degrees C. to 40 degrees C., the position of the intersection with the X axis clearly varies, even though it is a relatively small variation. This also applies to an intersection of the X axis (i.e., the real component axis) and a straight line connecting values corresponding to a frequency that is different from 0.03 Hz.

As illustrated in FIG. 12, due to the variation in the position of correction reference point described above, the point on which the correction reference points converge, i.e., the correction reference point as explained in FIG. 7 and FIG. 8 also varies depending on the temperature of the battery 10. As a result, the slope of the straight line connecting the correction reference point and any of the values of the plurality of complex impedances corresponding to the first predetermined frequency (i.e., the value corresponding to the impedance slope after the correction as explained in FIG. 7 and FIG. 8) also varies depending on the temperature of the battery 10. Moreover, the slope of the straight line connecting the values of the plurality of complex impedances corresponding to the first predetermined frequency (i.e., the impedance slope before the correction) also varies depending on the temperature of the battery 10. Thus, in an area other than an area in which the impedance slope is constant, i.e., in a first variation area with a relatively large variation width and in a second variation area with a relatively small variation width, the relation between the impedance slope and the SOC or SOH collapses, and the SOC or SOH of the battery 10 cannot be accurately estimated. In other words, if the SOC or SOH is estimated in the first variation area and the second variation area in the same manner as in another temperature area, then, an inaccurate value, which is different from an actual value, may be estimated.

The battery state estimating apparatus 100 according to the first embodiment is configured to perform the following operation as detailed below, in order to solve such technical problems.

(6) Explanation of Operation

Figure 13:
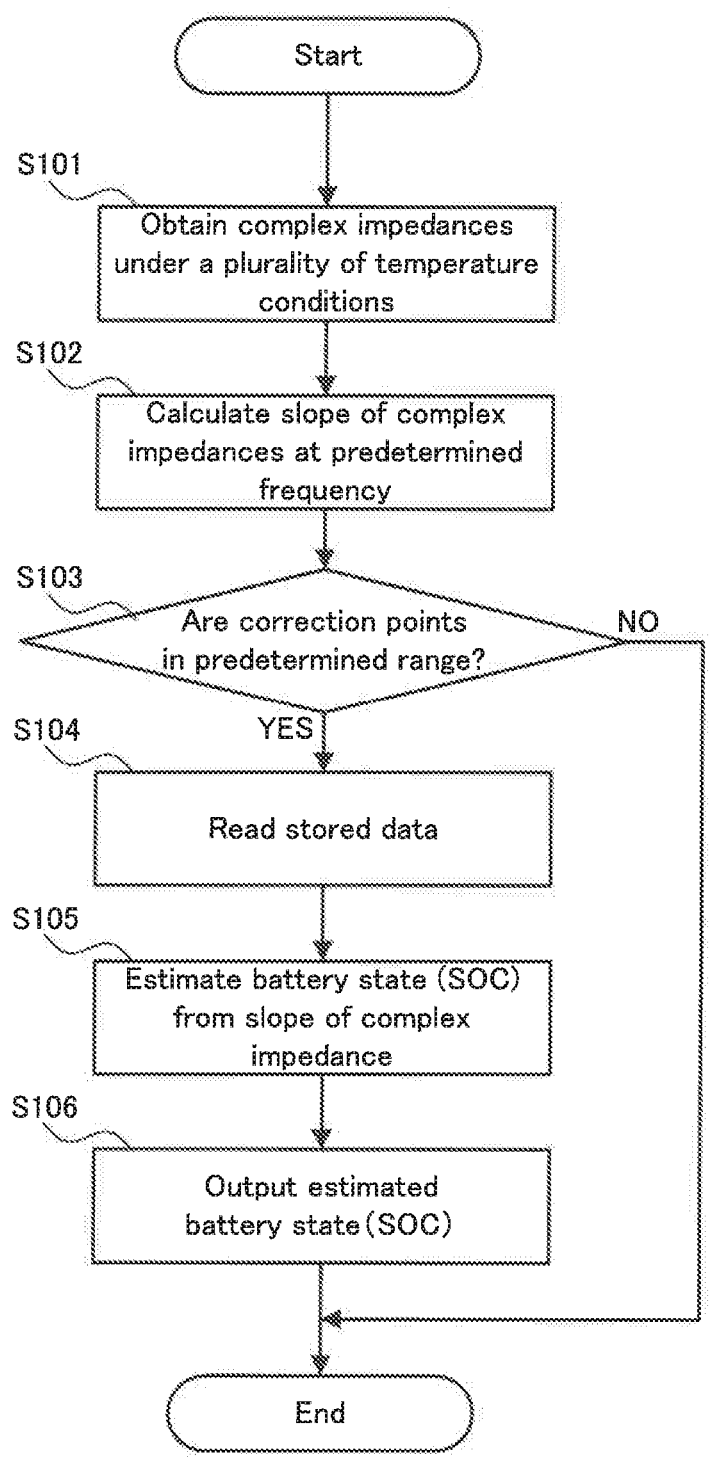
FIG. 13 is a flowchart illustrating a flow of the operation of the battery state estimating apparatus according to the first embodiment.

A specific flow of the operation of the battery state estimating apparatus 100 according to the first embodiment will be briefly explained with reference to FIG. 13. FIG. 13 is a flowchart illustrating a flow of the operation of the battery state estimating apparatus 100 according to the first embodiment.

As illustrated in FIG. 13, in operation of the battery state estimating apparatus 100 according to the first embodiment, the impedance acquirer 110 firstly obtains the complex impedances of the battery 10 under a plurality of temperature conditions in which the battery 10 has different internal temperatures (step S101). In other words, the impedance acquirer 110 obtains a plurality of complex impedances corresponding to different temperatures. At this time, it is preferable to obtain the plurality of complex impedances in a condition in which the battery states to be estimated (or the SOC or SOH herein) can be regarded as being the same or almost the same. It is thus not preferable to take a long time to obtain the plurality of complex impedances. The temperature of the battery 10 significantly varies even in extremely low discharge or the like. Thus, the complex impedances can be obtained under the plurality of different temperature conditions, even in substantially the same SOC or SOH.

After the acquisition of the complex impedances, the slope calculator 120 calculates the impedance slope from the obtained plurality of complex impedances (step S102). In other words, as illustrated in FIG. 2 to FIG. 4, the slope calculator 120 calculates the slope of the straight line connecting the values of the plurality of complex impedances corresponding to the first predetermined frequency, as the impedance slope. The slope calculator 120 may also perform the correction process, as explained in FIG. 7 and FIG. 8, on the calculated impedance slope. In other words, the impedance slope may be corrected to a slope based on the correction reference point.

After the calculation of the impedance slope, the temperature determinator 130 determines whether or not a plurality of correction reference points are in a predetermined range (step S103). In other words, it is determined whether or not a plurality of correction reference points, which are calculated in correcting the impedance slope, converge on a range set in advance. The "predetermined range" may be set in advance to determine whether or not the temperature of the battery 10 is suitable to estimate the SOC or SOH. If only one correction reference point is calculated, or if the correction process for the impedance slope is not performed, a new plurality of correction reference points may be calculated at this stage.

As already illustrated in FIG. 11, it is known that the correction reference points converge on a constant value in the temperature area that is suitable to estimate the SOC or SOH of the battery. It is thus possible to determine whether or not the temperature of the battery 10 is in a range that is suitable to estimate the SOC or SOH, depending on whether or not the correction reference points converge on the predetermined range.

If it is determined that the correction reference points are in the predetermined range (the step S103: YES), the battery state estimator 150 reads the relation between the impedance slope and the SOC, which is stored in advance, from the storage 140 (step S104), and estimates a current SOC or SOH of the battery 10 from the calculated impedance slope (step S105). The battery state estimator 150 then outputs the estimated value of the SOC of the battery 10 to the exterior (step S106). The outputted value of the SOC, for example, may be displayed on a display that can be visually recognized by an occupant of the vehicle, or may be used for vehicle running control.

On the other hand, if it is determined that the correction reference points are not in the predetermined range (the step S103: NO), it is determined that the temperature of the battery 10 is not in the temperature area that is suitable to estimate the SOC or SOH, and the steps S104 to S106 are not performed. It is thus possible to prevent the output of an inaccurate SOC or SOH. Then, a series of steps for estimating the SOC or SOH of the battery 10 according to the first embodiment is completed. The process may be restarted from the step S101 after a lapse of a predetermined period.

As explained above, according to the battery state estimating apparatus 100 in the first embodiment, it is possible to estimate the SOC or SOH of the battery 10, by using the impedance slope and the temperature area of the battery 10 determined from the correction reference point. In the first embodiment, it is required to obtain a parameter directly or indirectly indicating the temperature of the battery 10 in order to determine whether or not the temperature of the battery 10 is in an appropriate area; however, the parameter may be information that allows the determination of whether or not the temperature of the battery 10 is in the predetermined temperature area, and it is not required, for example, to detect the temperature of the battery 10 with high accuracy. Thus, the SOC or SOH can be estimated even when the temperature of the battery 10 cannot be accurately detected.

Second Embodiment

Next, a battery state estimating apparatus according to a second embodiment will be explained. The second embodiment is partially different from the first embodiment in operation, and the other part is substantially the same. Thus, hereinafter, a different part from that of the first embodiment explained above will be explained in detail, and an explanation of the same part will be omitted.

Figure 14:
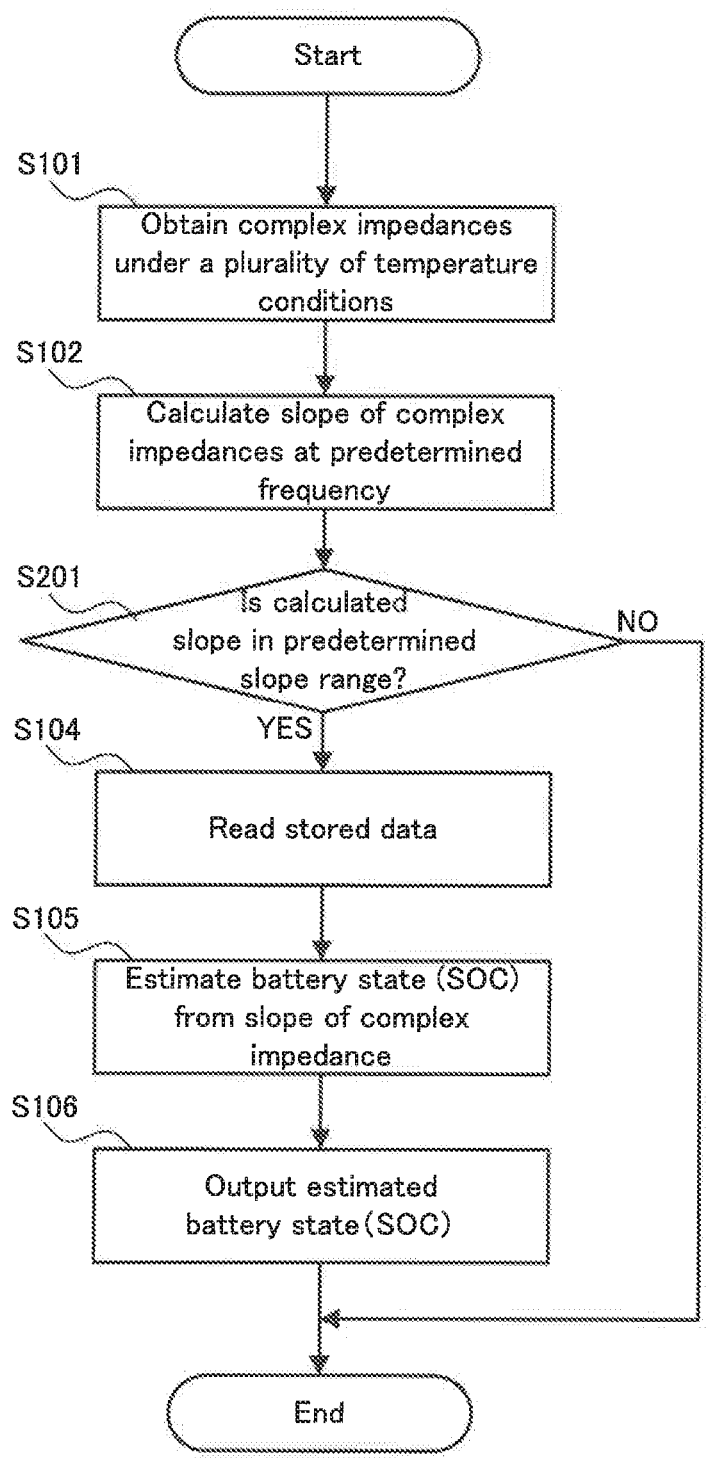
FIG. 14 is a flowchart illustrating a flow of the operation of a battery state estimating apparatus according to a second embodiment.

A specific flow of the operation of the battery state estimating apparatus 100 according to the second embodiment will be briefly explained with reference to FIG. 14. FIG. 14 is a flowchart illustrating a flow of the operation of the battery state estimating apparatus 100 according to the second embodiment. FIG. 14 carries the same reference numerals as those for the same steps illustrated in FIG. 13.

As illustrated in FIG. 14, in operation of the battery state estimating apparatus 100 according to the second embodiment, the impedance acquirer 110 firstly obtains the complex impedances of the battery 10 under a plurality of temperature conditions in which the battery 10 has different internal temperatures (the step S101). After the acquisition of the complex impedances, the slope calculator 120 calculates the impedance slope from the obtained plurality of complex impedances (the step S102). In other words, so far, the same process as in the first embodiment is performed.

After the calculation of the impedance slope, the temperature determinator 130 determines whether or not the calculated impedance slope is in a predetermined slope range (step S201). The "predetermined slope range" may be set in advance to determine whether or not the temperature of the battery 10 is suitable to estimate the SOC or SOH.

As already illustrated in FIG. 12, the value of the impedance slope in the temperature area that is suitable to the SOC or SOH of the battery can be known by previous simulations or the like. It is thus possible to determine whether or not the temperature of the battery 10 is in the range that is suitable to estimate the SOC or SOH, from the impedance slope calculated by the slope calculator 120. Specifically, if the calculated impedance slope has a value corresponding to the first range, the second range, or the third range illustrated in FIG. 12, then, it can be determined that the temperature of the battery 10 has a value that is suited for the estimation. On the other hand, if the calculated impedance slope does not have the value corresponding to the first range, the second range, or the third range illustrated in FIG. 12 (in other words, if the impedance slope has a value corresponding to the first variation area or the second variation area), then, it can be determined that the temperature of the battery 10 does not have the value that is suited for the estimation.

If it is determined that the impedance slope is in the predetermined slope range (the step S201: YES), the battery state estimator 150 reads the relation between the impedance slope and the SOC, which is stored in advance, from the storage 140 (the step S104), and estimates the current SOC or SOH of the battery 10 from the calculated impedance slope (the step S105). The battery state estimator 150 then outputs the estimated value of the SOC of the battery 10 to the exterior (the step S106).

On the other hand, if it is determined that the impedance slope is not in the predetermined slope range (the step S201: No), it is determined that the temperature of the battery 10 is not in the temperature area that is suitable to estimate the SOC or SOH, and the steps S104 to S106 are not performed. It is thus possible to prevent the output of an inaccurate SOC or SOH. Then, a series of steps for estimating the SOC or SOH of the battery 10 according to the second embodiment is completed. The process may be restarted from the step S101 after a lapse of a predetermined period.

As explained above, according to the battery state estimating apparatus 100 in the second embodiment, it is possible to estimate the SOC or SOH of the battery 10, by using the impedance slope and the temperature area of the battery 10 determined from the impedance slope. Even in the second embodiment, it is required to obtain the parameter directly or indirectly indicating the temperature of the battery 10 in order to determine whether or not the temperature of the battery 10 is in an appropriate area; however, the parameter may be information that allows the determination of whether or not the temperature of the battery 10 is in the predetermined temperature area, and it is not required, for example, to detect the temperature of the battery 10 with high accuracy. Thus, the SOC or SOH can be estimated even in the situation in which the temperature of the battery 10 cannot be accurately detected.

Third Embodiment

Next, a battery state estimating apparatus according to a third embodiment will be explained. The third embodiment is partially different from the first and second embodiments in operation, and the other part is substantially the same. Thus, hereinafter, a different part from those of the first and second embodiments explained above will be explained in detail, and an explanation of the same part will be omitted.

Figure 15:
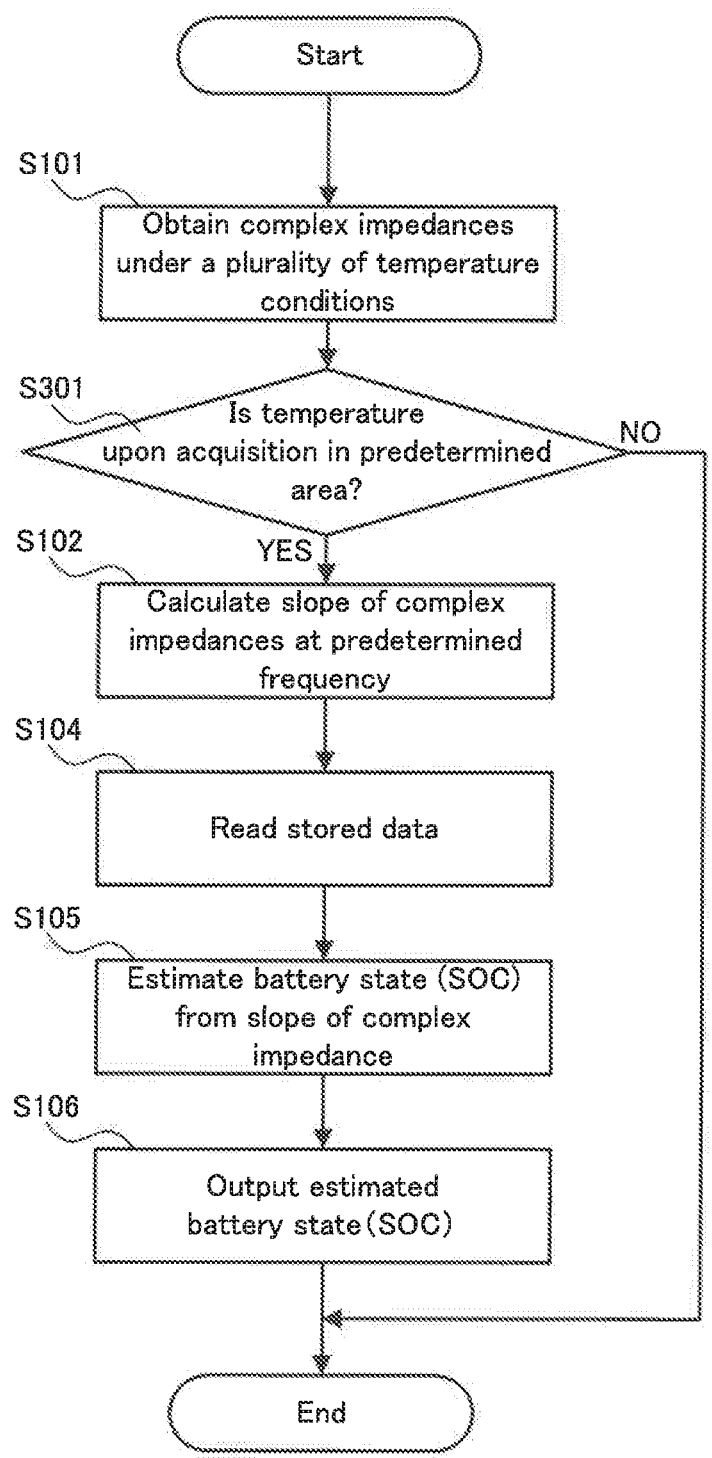
FIG. 15 is a flowchart illustrating a flow of the operation of a battery state estimating apparatus according to a third embodiment.

A specific flow of the operation of the battery state estimating apparatus 100 according to the third embodiment will be briefly explained with reference to FIG. 15. FIG. 15 is a flowchart illustrating a flow of the operation of the battery state estimating apparatus 100 according to the third embodiment. FIG. 15 carries the same reference numerals as those for the same steps illustrated in FIG. 13.

As illustrated in FIG. 15, in operation of the battery state estimating apparatus 100 according to the third embodiment, the impedance acquirer 110 firstly obtains the complex impedances of the battery 10 under a plurality of temperature conditions in which the battery 10 has different internal temperatures (the step S101). In other words, the same process as in the first and second embodiments is performed.

Then, particularly in the third embodiment, the temperature determinator 130 determines whether or not the temperature of the battery 10 upon acquisition of the complex impedance is in a predetermined temperature area (step S301). The temperature of the battery 10 used here may be directly detected from the battery 10 by using e.g., a temperature sensor or the like. Thus, without calculating the impedance slope unlike the first embodiment, it is possible to determine whether or not the temperature of the battery 10 is in the temperature area that is suitable to estimate the SOC or SOH. Moreover, it is preferable that the temperature of the battery 10 has a value when the complex impedance is actually obtained, but the temperature may have a value that is detected before the acquisition of the complex impedance.

If it is determined that the temperature of the battery 10 is in the predetermined temperature area (the step S301: YES), the slope calculator 120 calculates the impedance slope from the obtained plurality of complex impedances (the step S102). The battery state estimator 150 then reads the relation between the impedance slope and the SOC, which is stored in advance, from the storage 140 (the step S104), and estimates the current SOC or SOH of the battery 10 from the calculated impedance slope (the step S105). The battery state estimator 150 then outputs the estimated value of the SOC of the battery 10 to the exterior (the step S106).

On the other hand, if it is determined that the temperature of the battery 10 is not in the predetermined temperature area (the step S301: NO), it is determined that the temperature of the battery 10 is not in the temperature area that is suitable to estimate the SOC or SOH, and the steps S104 to S106 are not performed. It is thus possible to prevent the output of an inaccurate SOC or SOH. Then, a series of steps for estimating the SOC or SOH of the battery 10 according to the third embodiment is completed. The process may be restarted from the step S101 after a lapse of a predetermined period.

As explained above, according to the battery state estimating apparatus 100 in the third embodiment, the temperature detected from the battery is used to perform the determination process regarding the temperature of the battery 10. It is thus possible to prevent the estimation of the SOC or SOH of the battery 10 in inappropriate temperature area. Even for the temperature of the battery 10 detected in the third embodiment, it is required to provide a configuration that allows the determination of whether or not the temperature of the battery 10 is in the predetermined temperature area, and it is not required to provide a configuration that allows the detection of the temperature with high accuracy.

Fourth Embodiment

Next, a battery state estimating apparatus according to a fourth embodiment will be explained. The fourth embodiment is partially different from the first to third embodiments in operation, and the other part is substantially the same. Thus, hereinafter, a different part from those of the first to third embodiments explained above will be explained in detail, and an explanation of the same part will be omitted.

Figure 16:
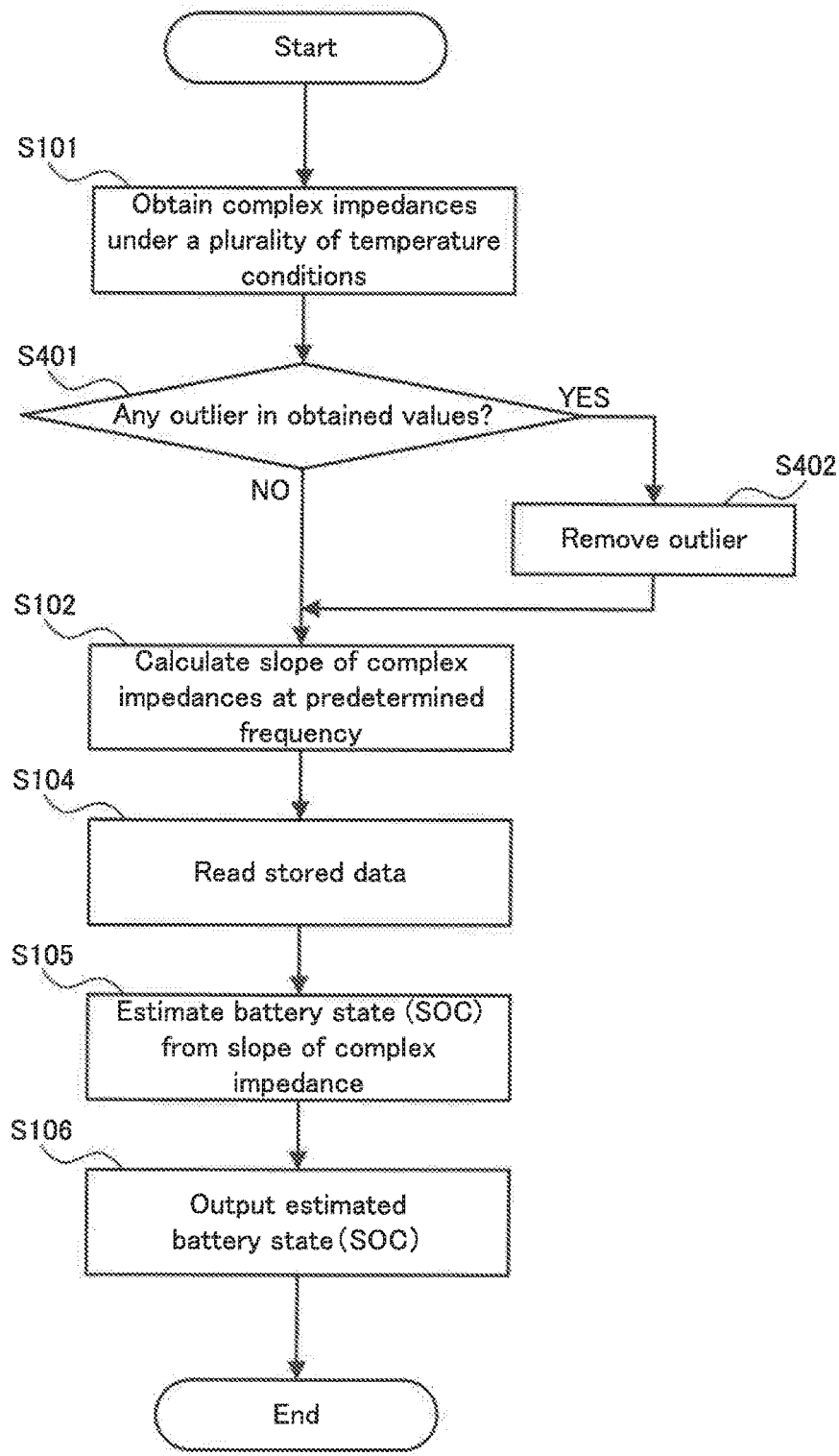
FIG. 16 is a flowchart illustrating a flow of the operation of a battery state estimating apparatus according to a fourth embodiment.

A specific flow of the operation of the battery state estimating apparatus 100 according to the fourth embodiment will be briefly explained with reference to FIG. 16. FIG. 16 is a flowchart illustrating a flow of the operation of the battery state estimating apparatus 100 according to the fourth embodiment. FIG. 16 carries the same reference numerals as those for the same steps illustrated in FIG. 13.

As illustrated in FIG. 16, in operation of the battery state estimating apparatus 100 according to the fourth embodiment, the impedance acquirer 110 firstly obtains the complex impedances of the battery 10 under a plurality of temperature conditions in which the battery 10 has different internal temperatures (the step S101). In other words, the same process as in the first to third embodiments is performed.

Then, particularly in the fourth embodiment, the temperature determinator 130 determines whether or not there is an outlier in the obtained values of the complex impedances (step S401). The "outlier" herein means a value of the complex impedances obtained in a condition in which the temperature of the battery 10 is not in the predetermined temperature area. Whether or not the value is the outlier may be determined by directly detecting the temperature of the battery 10 upon the acquisition. Alternatively, if the temperature of the battery 10 can be estimated from the obtained values of the complex impedances, an estimated value may be used for the determination.

If it is determined that there is the outlier in the obtained values of the complex impedances (the step S401: YES), the outlier is removed from the obtained complex impedances (step S402), and values other than the outlier are outputted to the slope calculator 120. On the other hand, if it is determined that there is no outlier in the obtained values of the complex impedances (the step S401: NO), the aforementioned removal process is not performed, and all the obtained complex impedances are outputted to the slope calculator 120.

The slope calculator 120 then uses the inputted complex impedances and calculates the impedance slope (the step S102). In particular, here, the outlier is removed from the complex impedances used to calculate the impedance slope by the steps S401 and S402. The impedance slope is thus calculated only from the complex impedances obtained in the temperature area that is suitable to estimate the SOC or SOH of the battery 10.

The battery state estimator 150 then reads the relation between the impedance slope and the SOC, which is stored in advance, from the storage 140 (the step S104), and estimates the current SOC or SOH of the battery 10 from the calculated impedance slope (the step S105). The battery state estimator 150 then outputs the estimated value of the SOC of the battery 10 to the exterior (the step S106).

As explained above, according to the battery state estimating apparatus 100 in the fourth embodiment, the outlier is removed from the obtained complex impedances before the calculation of the impedance slope. Thus, even if there are complex impedances that are obtained in an inappropriate temperature area, only the inappropriate outlier is removed, and the SOC or SOH of the battery can be accurately estimated.

The present disclosure may be embodied in other specific forms without departing from the spirit or essential characteristics thereof. The present embodiments and examples are therefore to be considered in all respects as illustrative and not restrictive, the scope of the disclosure being indicated by the appended claims rather than by the foregoing description and all changes which come in the meaning and range of equivalency of the claims are therefore intended to be embraced therein.

What is claimed is:

1. A battery state estimating apparatus comprising:
   an acquirer configured to obtain a plurality of complex impedances of a battery at a plurality of different temperatures;
   a calculator configured to calculate a slope of a first straight line or a slope of a second straight line as an impedance slope on a complex plane having an axis that is a real component of the complex impedance and an axis that is an imaginary component of the complex impedance, wherein the first straight line connects values of the obtained plurality of complex impedances at a first predetermined frequency, wherein the second straight line connects a convergence point and at least one of values of the plurality of complex impedances at a second predetermined frequency, wherein the convergence point is a point on which intersections of straight lines and the axis that is the real component converge when the second predetermined frequency is changed, and wherein each of the straight lines connects the values of the complex impedances at the second predetermined frequency;
   a determinator configured to determine whether or not a temperature of the battery is in a predetermined temperature area;
   a storage configured to store in advance a relation between the impedance slope and a battery state associated with the battery; and
   an estimator configured to estimate the battery state associated with the battery on the basis of the calculated impedance slope calculated by said calculator and the relation stored in said storage, when it is determined that the temperature of the battery is in the predetermined temperature area.

2. The battery state estimating apparatus according to claim 1, wherein said estimator is configured not to estimate the battery state associated with the battery when it is determined that the temperature of the battery is not in the predetermined temperature area.

3. The battery state estimating apparatus according to claim 1, wherein said determinator is configured (i) to obtain information about an intersection of the first or second straight line and the axis that is the real component, (ii) to determine that the temperature of the battery is in the predetermined temperature area when the intersection is in a predetermined range, and (iii) to determine that the temperature of the battery is not in the predetermined temperature area when the intersection is not in the predetermined range.

4. The battery state estimating apparatus according to claim 1, wherein said determinator is configured (i) to obtain information about a slope of the first or second straight line, (ii) to determine that the temperature of the battery is in the predetermined temperature area when the slope of the first or second straight line is in a predetermined slope range, and (iii) to determine that the temperature of the battery is not in the predetermined temperature area if the slope of the first or second straight line is not in the predetermined slope range.

5. The battery state estimating apparatus according to claim 1, wherein said determinator is configured (i) to obtain an acquisition temperature, which is a temperature of the battery when or before said acquirer obtains the plurality of complex impedances, (ii) to determine that the temperature of the battery is in the predetermined temperature area when the acquisition temperature is in the predetermined temperature area, and (iii) to determine that the temperature of the battery is not in the predetermined temperature area when the acquisition temperature is not in the predetermined temperature area.

6. The battery state estimating apparatus according to claim 1, wherein said calculator is configured to calculate the impedance slope (i) by using a complex impedance obtained when the temperature of the battery is in the predetermined temperature area, but (ii) without using a complex impedance obtained when the temperature of the battery is not in the predetermined temperature area, out of the plurality of complex impedances obtained by said acquirer.

7. The battery state estimating apparatus according to claim 1, wherein the battery state includes a value indicating a charge amount of the battery.

8. The battery state estimating apparatus according to claim 1, wherein the battery state includes a value indicating a degradation degree of the battery.

* * * * *